United States Patent [19]
Kowalski et al.

[11] Patent Number: 6,005,225
[45] Date of Patent: Dec. 21, 1999

[54] THERMAL PROCESSING APPARATUS

[75] Inventors: Jeffrey M. Kowalski, Dove Canyon; Christopher T. Ratliff, Corona del Mar; Terry A. Koble, Jr., Laguna Hills; Jon H. Pack, Norco; Michael H. Yang, Cerritos, all of Calif.

[73] Assignee: Silicon Valley Group, Inc., San Jose, Calif.

[21] Appl. No.: 08/827,542

[22] Filed: Mar. 28, 1997

[51] Int. Cl.⁶ .................. H05B 3/06; H05B 3/66; F27D 15/02; C23C 16/00
[52] U.S. Cl. .................. 219/390; 219/411; 219/536; 118/725; 118/50.1
[58] Field of Search .................. 219/390, 405, 219/411, 536, 537, 542, 550, 551; 118/50.1, 724, 725; 165/61, 66, 104.11, 104.19, 104.33; 250/492.2

[56] References Cited

U.S. PATENT DOCUMENTS

| | | | |
|---|---|---|---|
| 2,856,500 | 10/1958 | Hartman | 219/536 |
| 3,226,254 | 12/1965 | Reuschel . | |
| 4,062,318 | 12/1977 | Ban et al. . | |
| 4,263,872 | 4/1981 | Ban . | |
| 4,268,742 | 5/1981 | Cottrell et al. | 219/536 |
| 4,339,645 | 7/1982 | Miller . | |
| 4,363,959 | 12/1982 | Cottrell et al. | 219/542 |
| 4,493,089 | 1/1985 | Abell | 373/130 |
| 4,559,412 | 12/1985 | Howard et al. | 174/138 J |
| 4,695,706 | 9/1987 | Mizushina . | |
| 4,770,590 | 9/1988 | Hugues et al. . | |
| 4,849,608 | 7/1989 | Muraoka et al. | 219/390 |
| 4,926,793 | 5/1990 | Arima et al. . | |
| 5,038,019 | 8/1991 | McEntire et al. | 219/390 |
| 5,076,206 | 12/1991 | Bailey et al. . | |
| 5,095,192 | 3/1992 | McEntire et al. | 219/390 |
| 5,097,890 | 3/1992 | Nakao | 165/61 |
| 5,124,534 | 6/1992 | Williams et al. | 219/536 |
| 5,127,365 | 7/1992 | Koyama et al. . | |
| 5,187,771 | 2/1993 | Uchida | 392/416 |
| 5,229,576 | 7/1993 | Nakao et al. | 219/390 |
| 5,249,960 | 10/1993 | Monoe | 432/152 |
| 5,320,680 | 6/1994 | Learn et al. . | |

(List continued on next page.)

FOREIGN PATENT DOCUMENTS

| | | |
|---|---|---|
| 0164928 | 12/1985 | European Pat. Off. . |
| 61-114522 | 6/1986 | Japan . |
| 62-136810 | 6/1987 | Japan . |
| 62-245624 | 10/1987 | Japan . |
| 1-253229 | 10/1989 | Japan . |
| 2-103934 | 4/1990 | Japan . |
| 5-006894 | 1/1993 | Japan . |
| 61-290713 | 12/1996 | Japan . |
| 96/27897 | 9/1996 | WIPO . |

*Primary Examiner*—Joseph Pelham
*Attorney, Agent, or Firm*—Wilson Sonsini Goodrich & Rosati

[57] ABSTRACT

A vertical rapid heating furnace for treating semiconductor wafers comprising a hot wall reaction tube positioned within a cylindrical array of circular parallel heating elements substantially concentric therewith, each heating element being spaced from the hot wall reaction tube, each heating element comprising a coil of resistance heating conductor. The coiled resistance heating conductor can be a coil of resistance heating wire, the coil having an outer diameter of from 1 to 7 mm and supported in an annular heating element support. Each heating element support is dimensioned to support and accommodate the thermally expanded heating element supported therein at both the minimum and maximum furnace temperatures. Preferably, each annular heating element support is provided by an annular recess in the insulation surrounding the array of heating elements. The preferred vertical rapid heating and cooling furnace for treating semiconductor wafers comprises a hot wall reaction tube and a cylindrical array of circular parallel heating elements substantially concentric therewith and spaced therefrom to define a cooling gas passageway between said hot wall reaction tube and said cylindrical array of heating elements. The cooling gas passageway has lower and upper ends, the furnace has a cooling gas inlet opening in communication with said lower end, and a cooling gas exhaust outlet in communication with said upper end.

68 Claims, 8 Drawing Sheets

U.S. PATENT DOCUMENTS

| | | | |
|---|---|---|---|
| 5,324,920 | 6/1994 | Nakao | 392/416 |
| 5,346,555 | 9/1994 | Nunotani et al. | 118/724 |
| 5,360,336 | 11/1994 | Monoe | 432/152 |
| 5,443,649 | 8/1995 | Sibley . | |
| 5,482,558 | 1/1996 | Watanabe et al. . | |
| 5,506,389 | 4/1996 | Hidano et al. | 219/390 |
| 5,507,639 | 4/1996 | Monoe | 432/152 |
| 5,525,057 | 6/1996 | Monoe | 432/152 |
| 5,536,919 | 7/1996 | Taheri | 219/390 |
| 5,578,232 | 11/1996 | Engelke | 219/536 |
| 5,616,264 | 4/1997 | Nishi et al. | 219/494 |
| 5,618,351 | 4/1997 | Koble, Jr. et al. . | |
| 5,622,639 | 4/1997 | Kitayama et al. | 219/390 |
| 5,626,680 | 5/1997 | Porter et al. . | |
| 5,676,869 | 10/1997 | Nakayama et al. | 219/390 |
| 5,679,168 | 10/1997 | Porter et al. | 118/725 |
| 5,763,856 | 6/1998 | Ohkase | 219/390 |

Fig._1

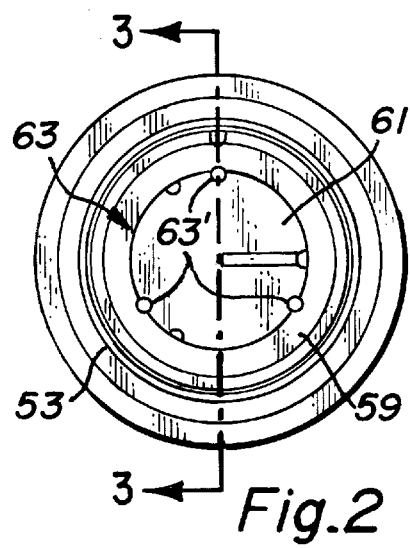
Fig.2
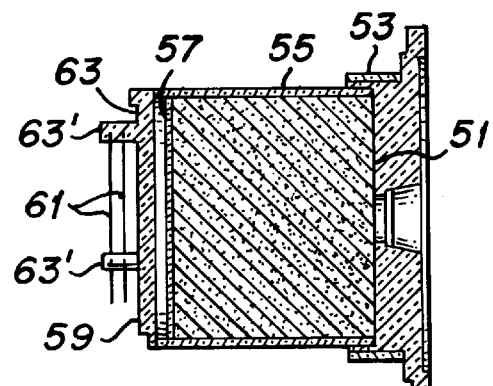
Fig.3
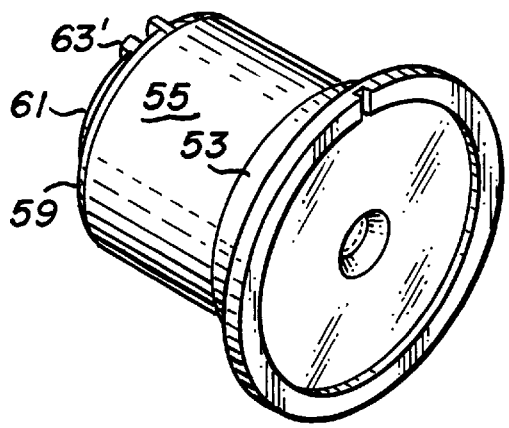
Fig.4
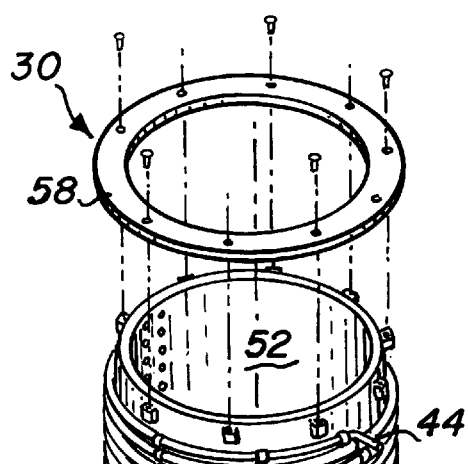
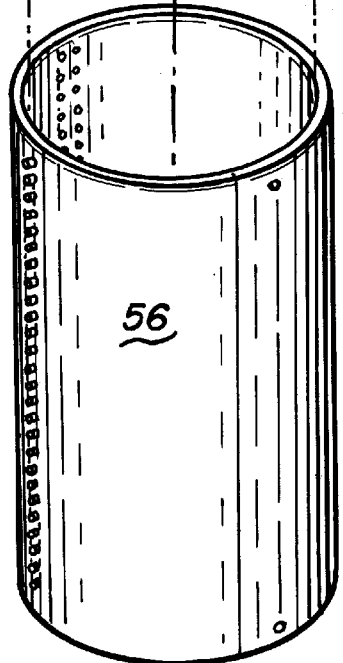
Fig.5

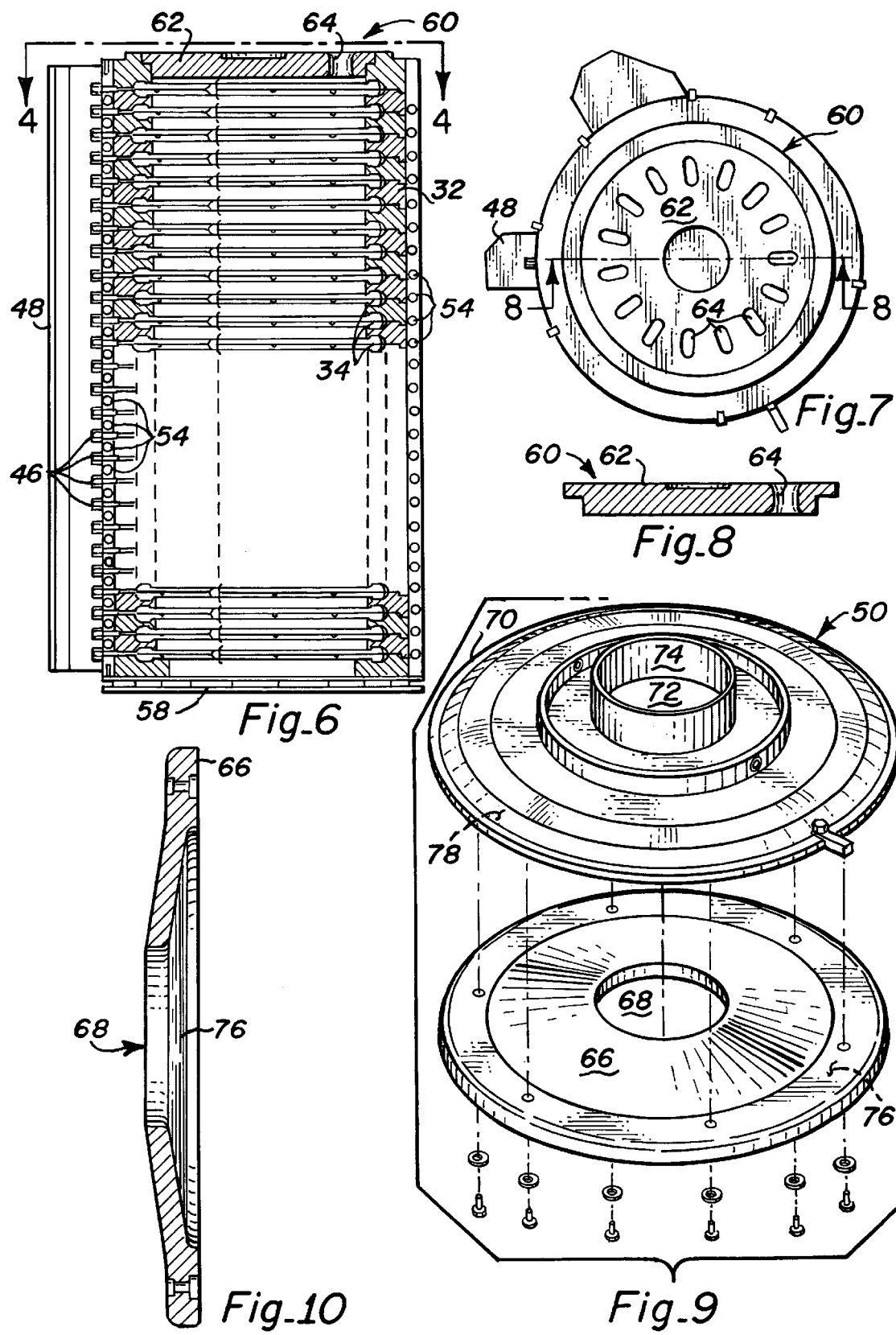

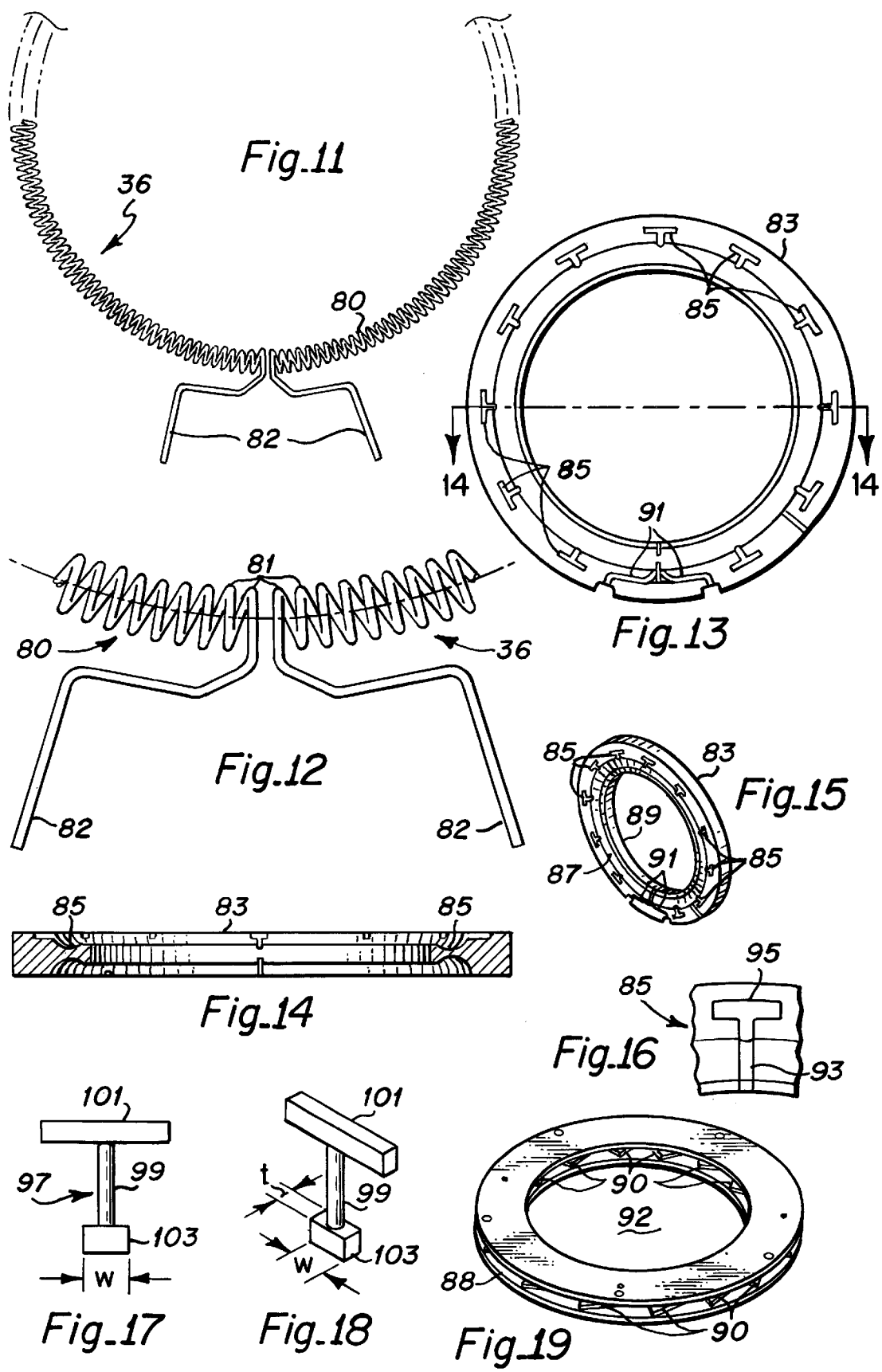

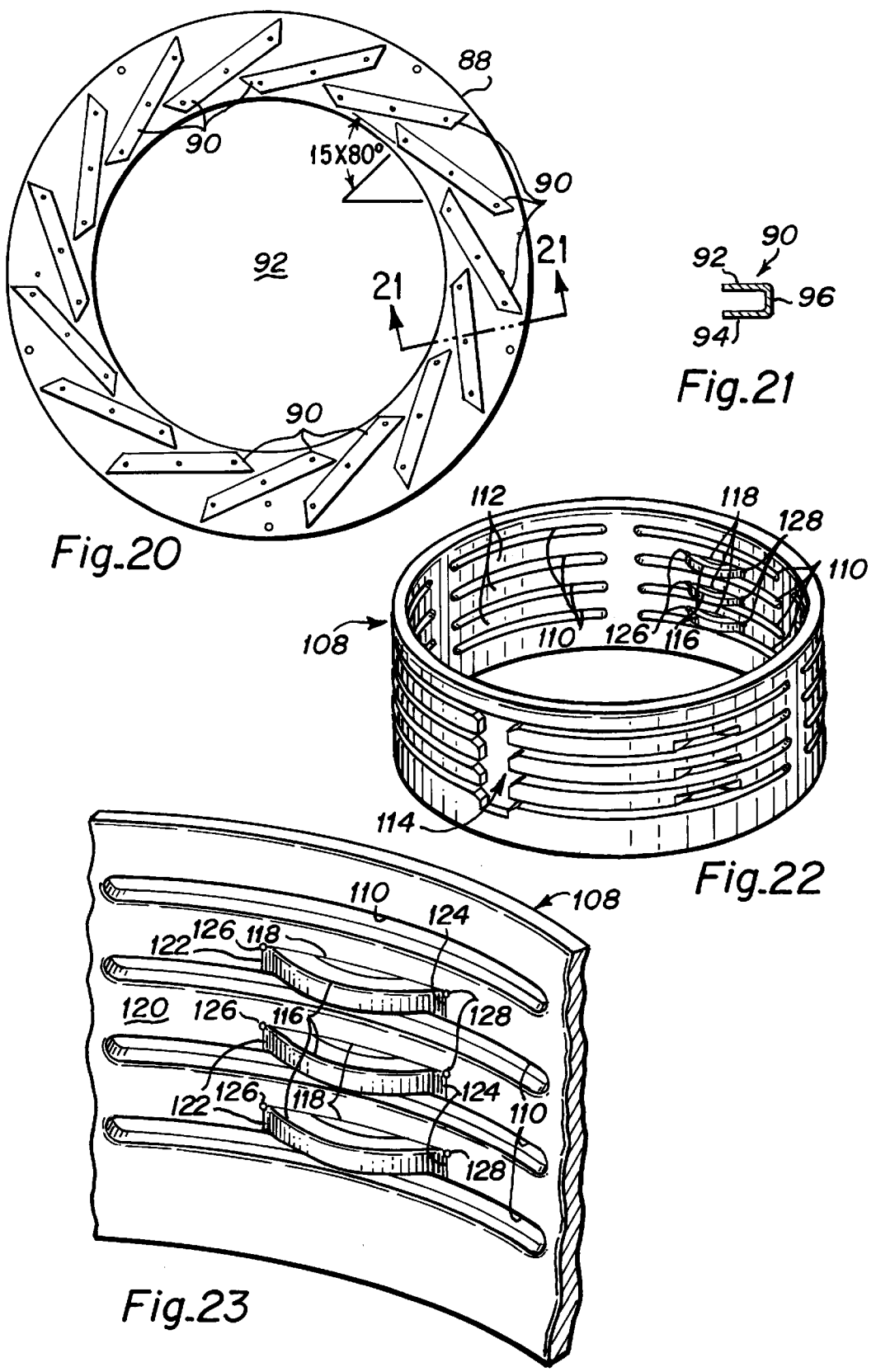

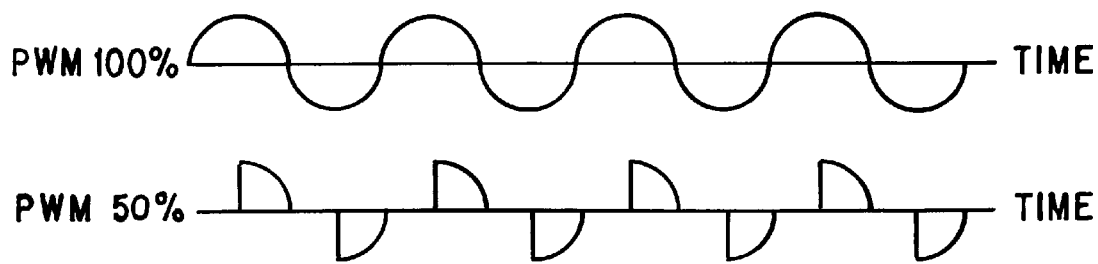
Fig_27
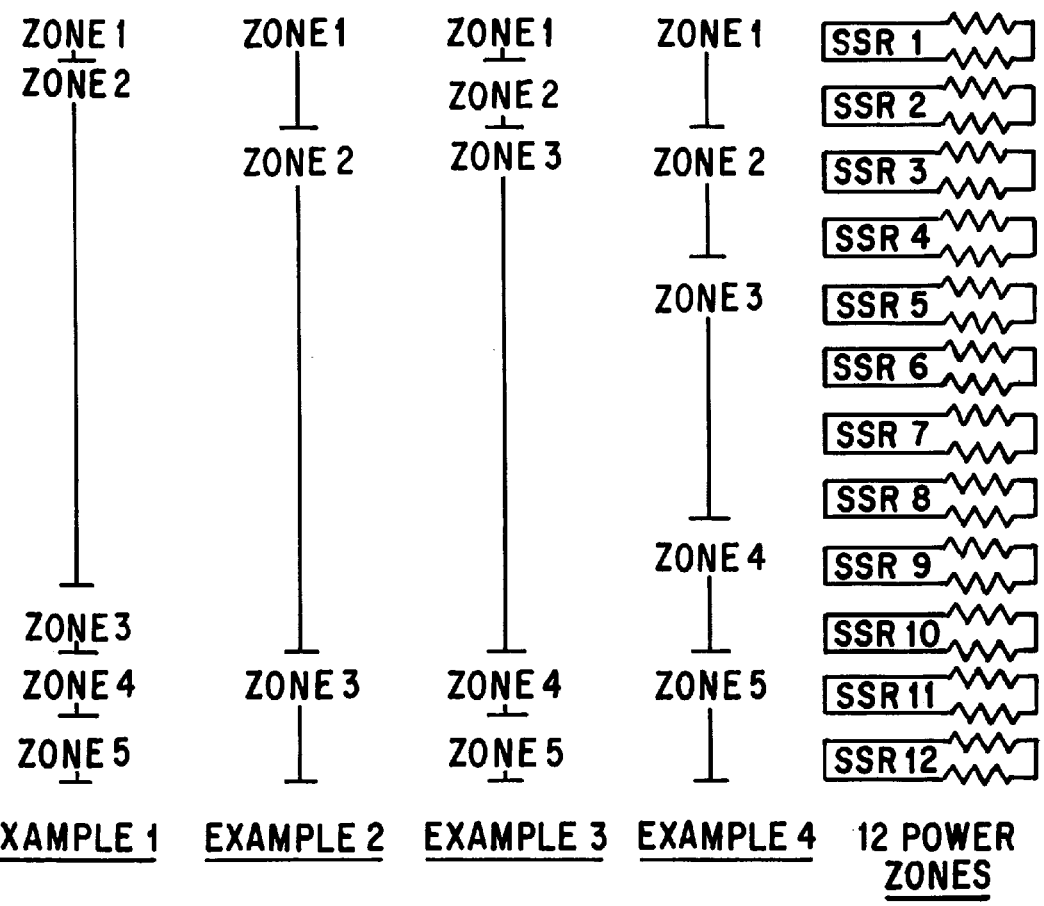
Fig_28

THERMAL PROCESSING APPARATUS

FIELD OF THE INVENTION

This invention relates to an improved thermal processing apparatus and process for heat treatment of semiconductor and glass wafer substrates and the like.

BACKGROUND OF THE INVENTION

Heat treatment devices have been used to form diffusion layers or form silicon oxide or nitride films on semiconductor or glass substrates in the manufacture of electronic devices. These substrates are typically thin wafers made of silicon or other semiconductor materials. The description of the device hereinafter will be provided in reference to wafer substrates, it being understood that the apparatus is equally suitable for treating any thin glass or semiconductor sheets, and treatment of any or all of these materials are considered to be within the scope of this invention.

These devices provide the desired heat treatment by heating the wafers in a reactor or heating chamber while introducing inert or reactive gases into the chamber. These heating chambers are surrounded by heating elements enclosed within an insulated shell. In order to treat large numbers of wafers in a single heat treatment operation, it is conventional to support the wafers, one above the other in a parallel orientation, in a wafer boat. This combination is referred to hereinafter as a wafer stack.

Vertical furnaces generally have the furnace and coaxial wafer boat aligned along a vertical axis. The wafer boat loaded with wafers to be treated is raised into the furnace through a bottom opening before the treatment cycle and lowered from the furnace after treatment. A preferred vertical furnace designed to reduce particulate contaminants by eliminating gas eddy areas in the reaction chamber is described in U.S. Pat. No. 5,320,680.

Commonly assigned, copending applications Ser. No. 08/565,177, filed Nov. 11, 1995, and Ser. No. 08/563,875, filed Nov. 28, 1995, describe wafer boat structures which protect wafers during rapid heating and cooling cycles and which are particularly effective with the furnace of this invention.

The prior art furnaces are limited by the ability of their heating systems to rapidly raise and lower furnace temperatures. Japanese patent application publication Hei 4-184923, to Nishimura et al. (Jul. 1, 1992), describes a heat treatment apparatus designed to reduce the heating time. The heating and cooling cycle times for the Nishimura et al. system are limited by the provision of additional heat sink materials to support the wafers, since they increase the power requirements and times for the heating and cooling phases.

OBJECTS AND SUMMARY OF THE INVENTION

It is an object of this invention to provide a furnace system with a rapid heating phase and a rapid cooling phase.

It is another object of this invention to provide a rapid heating furnace system which can obtain this result with standard, unmodulated commercial power.

It is a still further object of this invention to provide a furnace system which satisfies the objectives set forth above with a gas flow control system which substantially eliminates particulate contaminant-forming eddy areas.

A vertical rapid heating furnace for treating semiconductor wafers comprises a hot wall reaction tube positioned within a cylindrical array of circular parallel heating elements substantially concentric therewith, each heating element being spaced from the hot wall reaction tube, each heating element comprising a coil of helically wound resistance heating conductor.

Preferably, each annular heating element support is provided by an annular recess in the insulation surrounding the array of heating elements.

The preferred vertical rapid heating and cooling furnace for treating semiconductor wafers comprises a hot wall reaction tube and a cylindrical array of circular parallel heating elements substantially concentric therewith and spaced therefrom to define a cooling gas passageway between said hot wall reaction tube and said cylindrical array of heating elements. The cooling gas passageway has lower and upper ends, the furnace has a cooling gas inlet opening in communication with said lower end, and a cooling gas exhaust outlet in communication with said upper end.

Preferably, one end of the furnace includes a cylindrical insulating heat block to reduce heat loss from the volume defined by the hot wall reaction tube, with one or more silicon carbide disks preferably positioned between the cylindrical insulating heat block and the hot wall reaction tube. The top portion of the furnace preferably includes a furnace sealing surface, and the furnace preferably includes an insulating cap having a cap sealing surface dimensioned and mounted to form a sealing engagement with the furnace sealing surface to seal and insulate the top of the furnace during a heating cycle when in a first position, and to open the top of the furnace during a cooling cycle when in a second position.

The vertical rapid heating and cooling furnace is preferably combined with or used with a thermal treatment boat adapted to protect the wafers from excessive thermal stress during rapid heating and cooling. The thermal treatment boat preferably comprises a plurality of annular, coaxial, spaced-apart bands having substantially the same inner diameters, each band having an upper edge surface and a lower edge surface, the lower edge surface of the upper band of each set of adjacent bands being opposed to the upper edge surface of the lower band of each set and being spaced therefrom by a band spacing distance of from about 3.8 to 12.7 mm. Each band optimally has wafer support projections positioned to support a wafer substantially equidistant from the upper edge surface and lower edge surface of the respective band.

Optimally, each of the bands has a height, $Height_{Band}$, in mm according to the equation:

$$Height_{Band} = \frac{ColumnHeigt - \sum BandSpacing}{NumberBands}$$

wherein $Height_{Band}$ is $\geq$ wafer thickness; ColumnHeight is the total height of the treatment boat in mm; BandSpacing is the band spacing distance between adjacent bands in mm; and NumberBands is the total number of bands in the treatment boat.

A preferred embodiment of the vertical rapid heating furnace of this invention for treating semiconductor wafers comprises a hot wall reaction tube positioned within an array of circular heating elements substantially concentric therewith. Each heating element is spaced from the hot wall reaction tube, and each heating element comprises a coil of electrically independent resistance heating conductor, the furnace having a phase angle power control means for controlling power delivered to each heating element. The heating elements are present in groups, members of which are connected in series, and each group has a phase angle power controller. In one embodiment, the phase angle power control means includes a closed loop power controller means for variable element grouping of heating elements into a plurality of electrode sets, the electrodes in each set being connected in series.

BRIEF DESCRIPTION OF THE DRAWINGS

FIG. 2 is an end view of the alternative heat block construction of this invention for use when the apparatus is used in reverse flow reactions.

FIG. 3 is a cross-sectional view of the alternative heat block construction taken along the line 3—3 in FIG. 2.

FIG. 4 is an isometric view of the alternative heat block shown in FIGS. 2 and 3.

FIG. 5 is an exploded view of the water cooling jacket assembly of the furnace shown in FIG. 1.

FIG. 6 is cross-sectional view of the furnace assembly showing the heating element receptors, element base, and top insulating plate of this invention.

FIG. 7 is a view of the top insulating plate for the furnace assembly shown in FIG. 6.

FIG. 8 is a cross-sectional view of the insulating plate shown in FIG. 7, taken along the line 8—8.

FIG. 9 is an exploded view of the exhaust gas assembly for the furnace shown in FIG. 1.

FIG. 10 is a cross-sectional view of the end plate shown in FIG. 9.

FIG. 11 is a top view of a heating element coil according to this invention.

FIG. 12 is a detailed view of the electrical connectors for the coiled heating element shown in FIG. 11.

FIG. 13 is a top view of an insulation block of the assembly shown in FIG. 6.

FIG. 14 is a cross-sectional view of the insulation block of FIG. 13 taken along the line 14—14.

FIG. 15 is an enlarged view of the heating element anchor recess.

FIG. 16 is an isometric view of the insulation block of FIGS. 13–14.

FIG. 17 is a top view of a heating element anchor.

FIG. 18 is an isometric view of the heating element anchor of FIG. 17.

FIG. 19 is an isometric view of the element base shown in FIG. 9.

FIG. 20 is top view of the spacer assembly in the element base shown in FIG. 19

FIG. 21 is a cross-sectional view of a spacer shown in FIG. 20 taken along the line 21—21 therein.

FIG. 22 is an isometric view of a section of a preferred wafer boat for use in the processor of this invention.

FIG. 23 is a fragmentary, isometric view of the wafer support construction of the wafer boat of FIG. 20.

FIG. 27 is a representation of the power provided by the phase angle control system of this invention.

FIG. 28 is a schematic representation of several alternative groupings of the heating coils which could be selected with the closed loop power controller embodiment of this invention.

DETAILED DESCRIPTION OF THE INVENTION

The apparatus of this invention is used for thermal treatment of thin wafers or glass substrates, primarily in the preparation of semiconductor devices for the electronics industry. This apparatus processes the wafers or substrates, supported in a position where the wafers have a common, vertical central axis and a parallel, spaced-apart orientation. The wafers are positioned in a wafer boat or similar rack to provide a greatly reduced cycle process time without inflicting thermal stress damage to the wafers.

Figure 1:
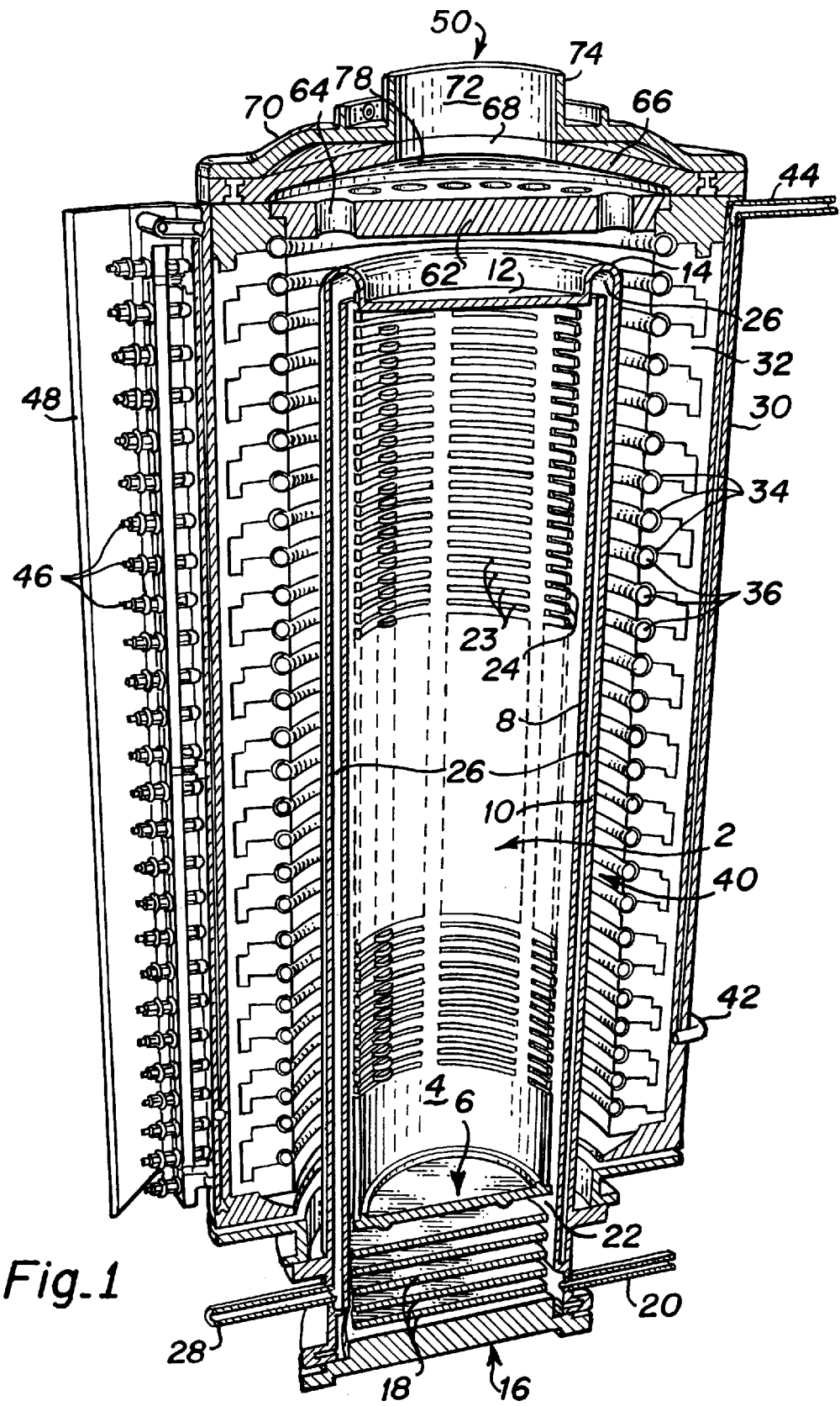
FIG. 1 is a cross-sectional view of the furnace of this invention with a wafer boat positioned in the treatment position within the furnace.

Referring to the cross-sectional view of the furnace shown in FIG. 1, the furnace comprises a central heating chamber 2 in which a wafer boat 4 is supported in the treatment position, mounted on retractable pedestal 6. Preferred wafer boat structures are described in copending applications Ser. No. 08/565,177, filed Nov. 11, 1995, and Ser. No. 08/563,875, filed Nov. 28, 1995, the entire contents of both applications being hereby incorporated by reference. These wafer boats protect the wafers during rapid heating cycles, preventing faults which result from extreme temperature differentials across the width of the wafers.

The wafer boat 4 is enclosed within a two-wall heating and reaction chamber formed by inner wall 8, outer wall 10, and curved top wall 12. This two-wall system is the subject of U.S. Pat. No. 5,320,680. Gas flowing in an upward direction between the wafer boat 4 and the inner wall 8 is directed by the curved surface 14 of the top wall 12 in a reverse direction between the inner wall 8 and the outer wall 10 and downward for removal from the system.

The heat block configuration in the apparatus of FIG. 1 is optimum for CVD processes where mutually reactive gases are preheated before mixing and are mixed at the bottom of the wafer boat immediately prior to their contact with wafers being treated. For such processes, the reaction gases are introduced from a gas supply inlet 20 into preheater section 16 with heat block plates 18. The heat block plates 18 reduce radiation heat loss from the bottom of the furnace and preheat reaction gases as they pass upward between the heat blocks and the opposed surface 22.

For thermal treatments, such as the production of thermal oxides such as silicon dioxide, the flow through the apparatus is in the reverse direction, the inlet gases passing through the conduit 28 upward between the inner wall 8 and outer wall 10 of the reaction chamber. The preheated gases are introduced into the top of the reaction chamber, pass downward past the wafers, and exit through conduit 20. For such thermal treatments, the heat block at the bottom of the wafer zone preferably has the construction shown in FIGS. 2–4, described below.

The preheater section communicates with the reaction chamber 2, directing the preheated gases into the space 24 between the wafer boat 4 and the inner wall 8.

In the reaction chamber, the rising gases diffuse through slotted openings or spacings 23 in the wafer boat and between the wafers (not shown) supported therein. At the top of the chamber, the spent reaction gases are directed by the curved section 14 downward into the space 26 between the inner wall 8 and the outer wall 10. Reaction gas products are removed from the bottom of the spacing 26 through exhaust port 28.

Surrounding the reaction zone is a shell with a water cooling jacket 30 and a cylindrical wall of insulation 32. The inner surface of the insulation has a plurality of annular recesses 34 which are receptors for the heating elements 36, details of which are shown in FIG. 6. Resistance heating elements 36 of this invention, shown in FIGS. 11 and 12, are supported in the annular recesses 34. The heating elements 36 and insulation 32 are opposed to and spaced from the outer wall 10 by a space 40.

The water cooling jacket 30 has a temperature regulating water inlet 42 and outlet 44, details of which are shown in greater detail in FIG. 5. The water jacket provides a controlled temperature environment for the system to provide more reproducible process conditions.

The heating elements 36 are supported to form an array with a cylindrical configuration to provide uniform heat to the reaction chamber. To achieve and maintain isothermal conditions and control the heating ramp, each heating element 36 is provided selected power separately from the other elements through a standard control system (not shown).

Each heating element 36 is connected to its individual power terminal 46. Protective safety shield 48 surrounds and isolates the electrodes. The electrodes are designed to operate using standard commercial power, e.g., 440 volt 3600 cycle AC current, and do not require any special power modulation equipment. Upon controlled application of the power, the reaction zone is rapidly heated to the desired reaction temperature. Using the preferred wafer boats described in Ser. No. 08/565,177, filed Nov. 1,1995, and Ser. No. 08/563,875, filed Nov. 28, 1995, the temperature in the reaction chamber can be uniformly raised from 21° C. up to 1100° C. at a rate of up to 100° C. per minute and higher.

Figure 24:
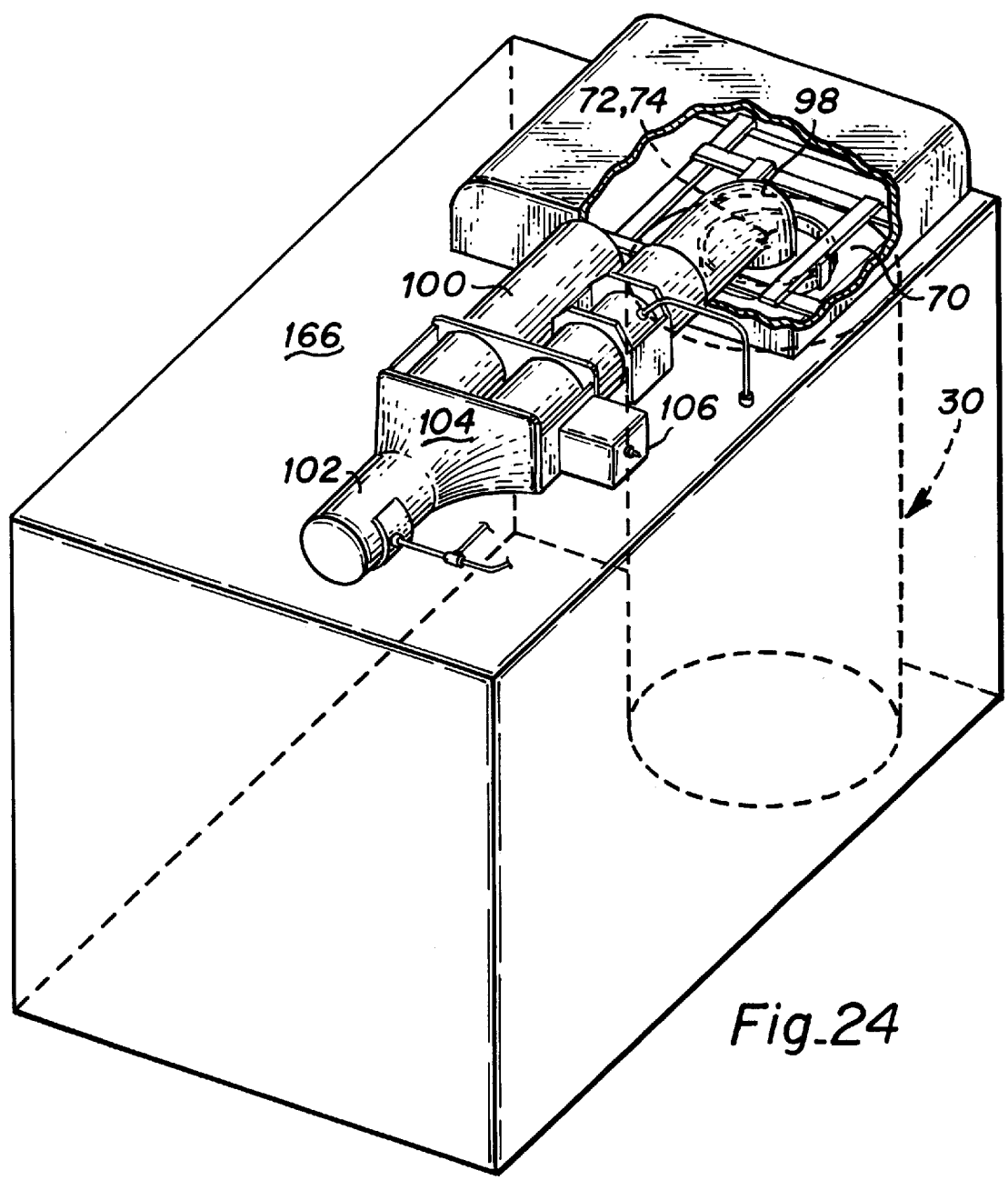
FIG. 24 is an isometric view of the cooling gas exhaust assembly of this invention.

The top of the furnace has a thermal barrier closure 50 which communicates with an exhaust system shown in greater detail in FIG. 24. Details of the closure 50 are shown in FIGS. 9 and 10. The bottom of the furnace system includes cooling air inlet vents 56 around the bottom and communicating with the space 40.

The preferred heat block construction is shown in FIGS. 2–4, wherein FIG. 2 is an end view of the alternative heat block construction of this invention for use when the apparatus is used in reverse flow reactions, FIG. 3 is a cross-sectional view of the alternative heat block construction taken along the line 3—3 in FIG. 2, and FIG. 4 is an isometric view of the alternative heat block shown in FIGS. 2 and 3. This solid heat block preferably has a center vacuum-formed alumina-silica core portion 51 enclosed in protective quartz sleeves 53 and 55 and cap layer 57. Quartz cap 59, supported on sleeve 55, in turn supports silicon carbide disks 61. Annular area 63 supports the wafer boat. The combination of the silicon dioxide disks 61 and the alumina-silica core 51 provide a greatly improved barrier to heat loss from the reaction zone. The silicon carbide disks 61 shield the door, reducing its temperature and protecting the sealing structure which include organic polymer o-rings. Because the emissivity of silicon carbide is substantially greater than quartz, the disks 61 absorb heat quickly and present a hot surface to the interior of the reaction zone, further reducing temperature reduction in the lower portions of the reaction chamber.

FIG. 5 is an exploded view of the water cooling jacket assembly of the furnace shown in FIG. 1. The assembly includes inner casing 52 upon which spiral wound coolant tubing 54 is mounted. The tubing 54 has a liquid inlet 42 and outlet 44. The tubing is enclosed in outer casing 56. The inner casing 52, tubing 54, and outer casing 56 are preferably axially concentric. The tube distribution provides heat removal to establish a uniform jacket temperature which can be controlled to be the same over a range of ambient temperatures. This facilitates the reproducible operation of the furnace and more accurate control of the treatment process.

FIG. 6 is a cross-sectional view of the furnace assembly showing the heating element receptors, element base, and top exhaust plate. The inner surface of the cylinder of stacked insulation 32 defines an array of electrical heating element receptors or recesses 34, which are preferably evenly spaced and in parallel planes. The bottom of the stack includes the element base 58, and the top of the stack includes the insulating plate 60.

The inner diameter and shape of the annular recesses 34 must be sized to support and secure the heating elements at both the ambient temperature and maximum temperatures through which the furnace operates. The coiled wire heating elements expand during the heating cycle and press against the back portion of the receptor surface. Placement of the back surface at a distance beyond the maximum expansion of the heating element is preferred.

FIG. 7 is a view of the top insulating plate for the furnace assembly shown in FIG. 6, and FIG. 8 is a cross-sectional view of the insulating plate shown in FIG. 7 taken along the line 8—8. The insulating plate 60 comprises a disk 62 of insulating material which is shaped about its outer perimeter to nest with the upper end of insulation 32. It is designed to minimize heat loss through the top of the furnace. The disk 62 has a circular array of cooling gas passageways 64 through which cooling gases can be exhausted during the cooling phase of the operation of the furnace.

FIG. 9 is an exploded view of the exhaust gas assembly for the furnace shown in FIG. 1, and FIG. 10 is a cross-sectional view of the end plate shown in FIG. 9. The exhaust gas assembly is mounted at the top of the furnace against the insulating plate 60 shown in FIG. 7. It comprises an intermediate exhaust plate 66 with an insulated central exhaust gas port 68 and an upper plate 70 coaxial therewith which has a central gas port 72 aligned with the gas port 68, the upper end of which has exhaust conduit tubular fitting 74. The intermediate exhaust plate 66 has a tapered inner surface 76 which forms an annular gas flow space 78 (shown in FIG. 1) between its lower surface and the upper surface of the insulating plate 60 for passage of exhaust gases flowing through cooling gas passageways in insulating plate 60 to the central exhaust port 68 for exit from the furnace.

FIG. 11 is a top view of a heating element according to this invention, and FIG. 12 is a detailed view of the electrical connectors for the heating element shown in FIG. 11. Each heating element 36 comprises a circular coiled heating element 80 sized to fit in an annular receptor 34 in the insulating column 32 (FIG. 1). The wire can have a resistance of from 1 to 2 Ohms, for example, and can be made from conventional resistance heater wires such as KANTHAL heating elements. The wire wound in a coiled configuration shown in FIG. 11 provides the high heat-generation capacity required for the rapid heating of the furnace using conventional resistance heating wires and using conventional power supplies, such as 480 Volt, 60 Hz power conventionally available from electrical power providers. This simplifies the power supply requirements and reduces the size of the overall assembly. Because the coils are electrically independent, the power provided to each coil or combinations of coils in parallel can be independently controlled to be separate from power delivered to other coils to increase temperature uniformity throughout operation of the furnace.

The power control system which enables use of the conventionally available power without the use of special power modulation transforms required by prior art systems is described hereinafter with respect to FIGS. 27 and 28.

The ends 82 of the wire 80 are connected to the electrical connectors 46 (FIGS. 1 and 2).

FIG. 13 is a top view of an insulation block of the assembly shown in FIG. 6, and FIG. 14 is a cross-sectional view of the insulation block of FIG. 13 taken along the line 14–14. FIG. 15 is an isometric view of the insulation block of FIGS. 13–14.

The insulation 32 (FIG. 6) is constructed of a stack of insulating blocks having the construction shown in FIG. 13. The insulation is preferably a silica-alumina material.

The insulation has the form of an annulus 83 with a circular array of heating element anchor recesses 85 in the upper surface thereof. The upper and lower inner surfaces 87 and 89 are curved to receive coiled heating elements 36 shown in FIGS. 1, 8 and 9. Grooves 91 extend from the inner curved surface 87 to the edge of the annulus 83 and have a shape which accommodates the shape of the ends 82 of the heating coil 80 (FIGS. 11 and 12).

FIG. 16 is an enlarged view of the heating element anchor recess. The T-shaped anchor recesses 85 comprise a radially extending groove 93 and a retaining grove 95 at an angle thereto, the retaining groove preferably being perpendicular to, or at right angles to, the radial groove.

FIG. 17 is a top view of a heating element anchor, and FIG. 18 is an isometric view of the heating element anchor of FIG. 17. The T-shaped anchor 97 has a longitudinal section 99 with an insulation anchor cross-piece 101 shaped and sized to fit into heating element retainer recess 85, and a heating element anchor cross-piece 103. The heating element anchor cross-piece 103 has a narrow vertical dimension "t" which is sufficiently narrow to allow insertion of the cross-piece 103 between adjacent spiral sections 81 of the heating element coil 80 (FIG. 12) when oriented in a plane substantially parallel to the axis of the coil, to a depth which places it in substantially the center of the spiral 81. The heating element cross-piece 103 has a width dimension "W" which is sufficient to lock the cross-piece 103 in the spiral when it is rotated 90° after insertion between adjacent spirals.

The heating element is secured to the insulation by inserting the cross-piece 103 between adjacent spirals, rotating it 90°, and placing the cross-piece 101 in its respective insulation groove 85. Stacking the insulation blocks 83 prevents escape of the cross-piece 103 from its receptor 85, and prevents rotation of the anchor to release the cross-piece 103 from the heating element.

This heating elements 80 undergo substantial dimensional changes during heating and cooling which would disrupt the insulation and/or release the heating elements if sufficient space were not made available for their expansion. Heating element receptor grooves are combined with the anchors 97 to provide the heating elements with full freedom of movement for radial expansion while maintaining a secure anchor of the heating coils to the insulation.

FIG. 19 is an isometric view of the element base shown in FIG. 6, and FIG. 20 is a top view of the spacer assembly in the element base shown in FIG. 19. The element base comprises upper annular plate 86 and lower annular plate 88 coaxial therewith and secured to the upper plate 86. The plates 86 and 88 are maintained in parallel planes by a circular array of spacers 90. The annular plates 86 and 88 define a central opening 92 though which the wafer boat can be raised into the furnace for wafer processing and lowered from the furnace after processing is completed.

FIG. 21 is a cross-sectional view of a spacer shown in FIG. 20, taken along the line 21—21. Each spacer has a U-shaped cross-section with a parallel upper wall 192 and lower wall 94 joined by bridge or backbone 96. The spacers reduce the cross-sectional area available for heat loss through conduction from plate 88 to plate 86, and maintain an opening between the plates 86 and 88 for cooling gas flow into the furnace for the cooling phase.

The rapid heating and cooling vertical furnace of this invention has a greater production capacity because it has a shorter heating phase and cooling phase. Because the system has a reaction chamber which, in cooperation with the wafer boat, minimizes or eliminates gas eddy areas, the process is cleaner, with a minimum level of contaminating particulates.

FIG. 22 is an isometric view of a section of a preferred wafer boat for use in the processor of this invention, and FIG. 23 is a fragmentary, isometric view of the wafer support construction of the wafer boat of FIG. 22. In this preferred embodiment, the boat is a quartz cylinder having a plurality of wafer slots 110, the upper and lower edges of which define the wafer protecting bands 112, and an effector or wafer loading slot 114. The wafer supports are inwardly extending strips 116. The upper edge 118 of each projection is formed by a single cut through the respective band 120 in a plane substantially perpendicular to said cylinder, with the ends 122 and 124 of the strip being integral with the band. Circular stress relief holes 126 and 128 are placed at the ends of each cut to eliminate the cuts as an origin of stress relief cracks during the heating and cooling to which the wafer boat is exposed. Further details about this and other suitable wafer boats with heat shields are described in commonly assigned, copending applications Ser. No. 08/565,177, filed Nov. 11, 1995, and Ser. No. 08/563,875, filed Nov. 28, 1995, the entire contents of both of these applications being hereby incorporated by reference.

The height of the heat shield bands and the distance between the edges of adjacent shields are critically important aspects of these heat shield wafer boats. They establish the size and positions of the wafer surfaces which are shielded from direct exposure to the heat sources and those further areas which are shielded from the heat sources which are nearest the wafer. They thus establish a heat conduction pattern in the wafers, which is from the inner wafer areas to the outer edges and center. With this heating pattern, temperature differences between the center and outer edges of the wafer are greatly reduced even during rapid heating, greatly reducing the cycle time required to eliminate destructive thermal damage to the wafers.

Preferably, the thermal treatment boat comprises a plurality of annular, coaxial, spaced-apart bands having substantially the same inner diameters, each band having an upper edge surface and a lower edge surface, the lower edge surface of the upper band of each set of adjacent bands being opposed to the upper edge surface of the lower band of each set, and being spaced therefrom by a band spacing distance of from about 3.8 to 12.7 mm, each band having wafer support projections positioned to support a wafer substantially equidistant from the upper edge surface and lower edge surface of the respective band. Optimally, each of the bands has a height, $Height_{Band}$, in mm according to the equation:

$$Height_{Band} = \frac{ColumnHeigt - \sum BandSpacing}{NumberBands}$$

wherein $Height_{Band}$ is $\geq$ wafer thickness; ColumnHeight is the total height of the treatment boat in mm; BandSpacing is the band spacing distance between adjacent bands in mm; and NumberBands is the total number of bands in the treatment boat.

FIG. 24 is an isometric view of the cooling gas exhaust assembly of this invention. The exhaust fitting 74 (FIG. 9) of the upper plate 70 is connected to furnace exhaust gas conduit or duct 98. The furnace cabinet 166 communicates with a cabinet exhaust gas conduit or duct 100. The two gas conduits 98 and 100 communicate with the central air exhaust conduit 102 through the Y-junction 104. Exhaust gas conduit is connected to a conventional exhaust fan system (not shown). Duct valve control 106 is connected to a conventional duct closure element (not shown), which can be rotated from an open to a closed position during the furnace heating cycle, and rotated from a closed position to an open position during the furnace cooling phase.

During furnace operation, air is constantly drawn through the cabinet enclosing the furnace to the exhaust duct through conduits 100 and 102. During the furnace heating cycle, conduit 98 is closed to prevent heat loss from the furnace. After the heating cycle, the control 106 opens the duct valve and opens the conduit 98 to the reduced pressure in exhaust conduit 102, causing atmospheric pressure to force air into the bottom of the furnace through the openings in the element base 56 (FIG. 1) or 58 (FIGS. 19 and 20), up through the furnace space 40, through the insulating plate openings 98 (FIGS. 6 and 8), through the openings 68 and 70 in end plates 66 and 70 (FIG. 9), and into the exhaust conduit or duct 90 (FIG. 24). This air flow quickly cools the interior and contents of the furnace.

The furnace exhaust gas conduit or duct 98 can be provided with a conventional heat exchanger (not shown) to remove heat from the exhaust during the cooling cycle. This may be required in some systems because of the presence of thermally unstable seals or other components in the waste gas ducts.

Figure 25:
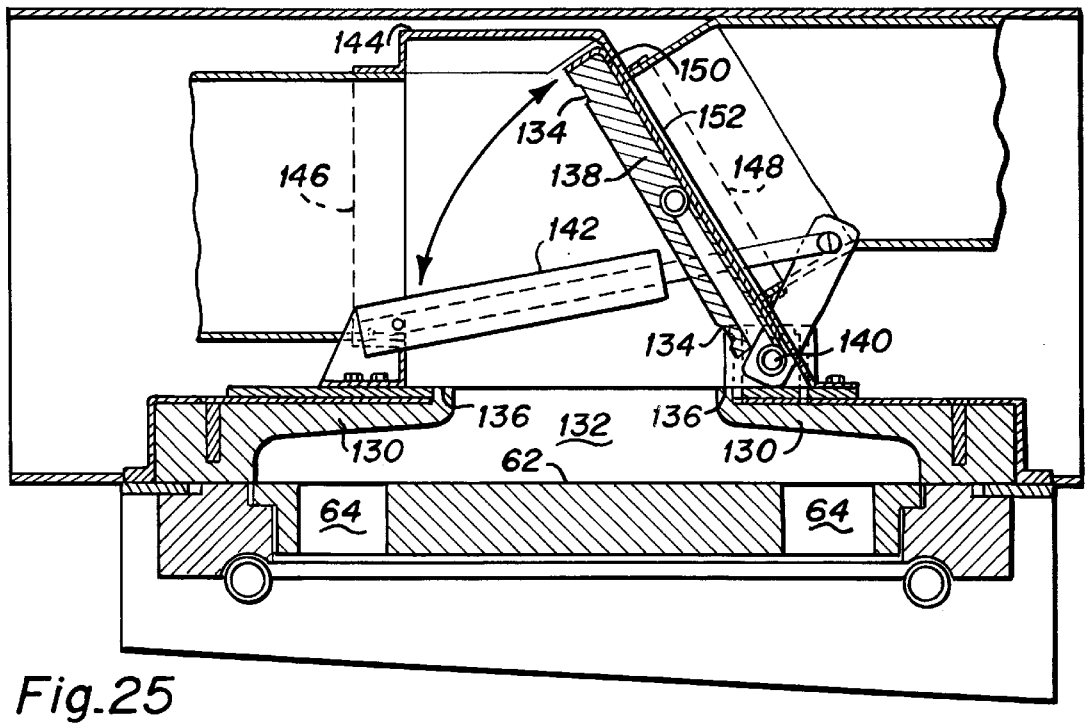
FIG. 25 is an alternate duct valve structure in the open or cooling cycle position.
Figure 26:
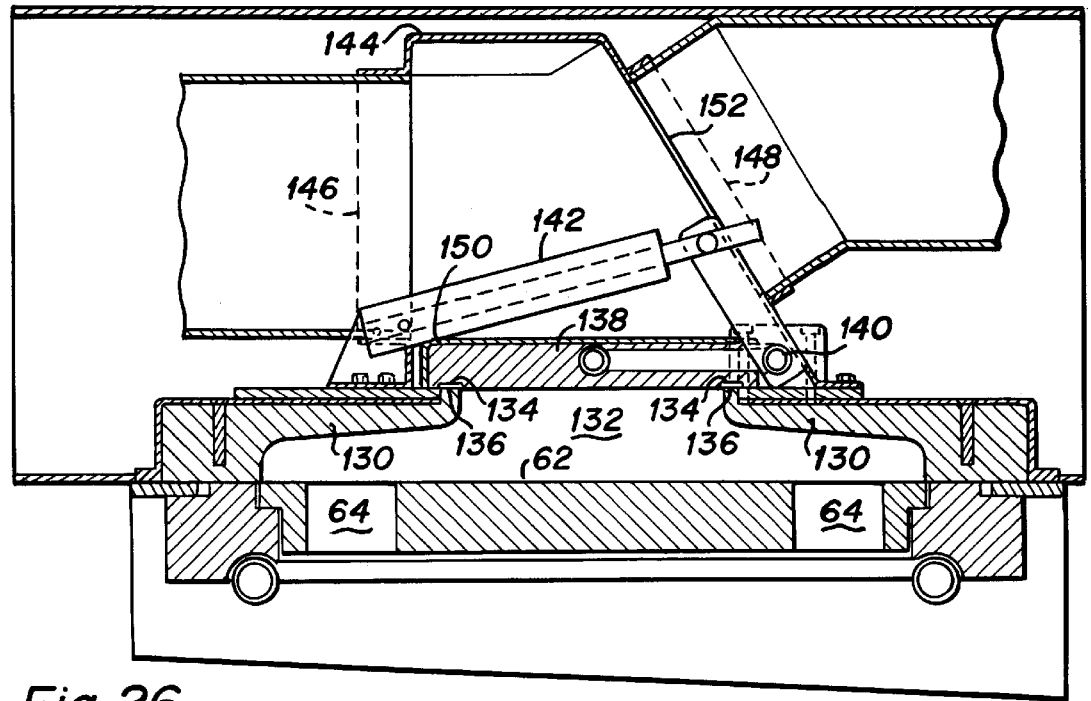
FIG. 26 is the alternate duct valve structure of FIG. 25 shown in the closed or heating cycle position.

FIGS. 25 and 26 show an alternate embodiment of the exhaust valve system. In this embodiment, FIG. 25 is an alternate duct valve structure in the open or cooling cycle position, and FIG. 26 is the alternate duct valve structure of FIG. 25 shown in the closed or heating cycle position. In this embodiment, central exhaust plate 130 defines an exhaust passage 132 with the upper surface the disk 62. The upper annular rim 134 of the central exhaust plate 130 is dimensioned to engage and form a seal with opposed annular recess 136 in pivotal insulated cap 138 when the cap is pivoted to the closed position shown in FIG. 26. Cap 138 is made of a conventional insulation material such as silica-alumina composite. Pivotal cap 138 pivots about axis 140 to the open position shown in FIG. 25, to the closed position shown in FIG. 26, and vice versa. The pivotal cap 138 is rotated from the open and closed position by actuation of conventional hydraulic piston 142.

The exhaust duct system in this embodiment includes a central duct portion 144 having an exhaust opening 146 communicating with the duct leading to the facility exhaust system, and an exhaust inlet opening 148 leading to the thermal processing unit cabinet for exhausting the cabinet.

When the cap 138 is in the open position shown in FIG. 25, the exhaust passage 132 communicates with the exhaust opening 146 to draw cooling air through the interior of the furnace. The upper surface 150 of the cap 138 abuts with sealing surface 152 of the inlet exhaust duct 148, closing the cabinet exhaust duct.

When cap 138 is in the closed position shown in FIG. 26, cooling air flow through the furnace is terminated, and heat is applied to and retained in the reaction zone of the furnace. Simultaneously, the cabinet exhaust passageway 148 is opened, causing cooling air to be drawn into the exhaust through the furnace cabinet to remove heat and any gases, such as hydrogen, which may escape into the cabinet.

FIG. 27 is a representation of the power provided by the phase angle control system of this invention, the upper signal representing phase angle control to provide power through the entire cycle (i.e., 100 percent) and the lower signal representing phase angle control to provide power through two 90 degree segments of each 360 degree cycle (i.e., 50 percent). The phase angle control is provided by a conventional silicon control rectifier (not shown), such as the SCR Assembly from Eurotherm; is positioned in the power delivery circuit in a conventional manner; and is responsive to conventional temperature feedback from the furnace. Systems used with semiconductor furnaces prior to this invention provided an integral cycle control with extended update times which can be as much as four seconds or longer. To increase resolution with prior art furnaces required increase of the cycle time. With the phase angle control embodiment of this invention, the response time is 8.3 mS for 60 Hz operation. Increased resolution can be obtained by increasing the timer base, the response time being fixed.

The individual heating elements of FIGS. 1, 11 and 12 are connected into groups by series connections of sets of power terminals 46. A preferred embodiment of the furnace has 26 coils 36 grouped in 9 sets of coils in a set order from top to bottom, as shown in Table A.

TABLE A

| Coil Hardware Zones | No. Coils | Software Zone No. |
| --- | --- | --- |
| 1 | 2 | 1 |
| 2 | 3 | 2 |
| 3 | 4 | 3 |
| 4 | 4 | 3 |
| 5 | 3 | 3 |
| 6 | 2 | 3 |
| 7 | 2 | 3 |
| 8 | 3 | 4 |
| 9 | 3 | 5 |

In this embodiment, the coils are grouped in nine hardware zones from top to bottom, each zone having the listed number of adjacent coils. The heating control has five software heating control zones, each zone associated with the hardware zones listed.

With this phase angle control system, partial power is provided in each AC cycle with a resolution of 1/4096. No step-down transformers with electric line regulation and output voltage controls for different line loads are required.

FIG. 28 is a schematic representation of several alternative groupings of the heating coils which could be selected with the closed loop power controller embodiment of this invention. In this closed loop power controller embodiment, the zones and coils associated therewith are variable and controlled by a central controller. FIG. 28 shows four examples of zone configurations for a set of 24 coils, grouped in pairs. The controller is operated to select configurations corresponding to these examples or other alternative configurations to obtain a desired heat distribution during the different heating phases of the furnace. Example 1 has the flat heating temperature zone toward the top of the reactor, Example 2 uses only three control zones, Example 3 has a large flat zone in the center, and Example 4 has a smaller flat zone in the center.

In these power control embodiments, the coils in each tray can be connected together in series to form larger coil groups. In the embodiment shown in FIG. 1, nine coil groups can be selected, and each coil group can be controlled by one solid state power controller. The solid state power controller adjusts the phase angle in each AC cycle to regulate the amount of power delivered to its respective coil group. In order to match the line voltage to the resistance of the coil group, the maximum control voltage to the solid state power controller is limited.

The control voltage to the solid state power controller is a function of the temperature inside the furnace. To increase power to the coil group, the control voltage will be increased. Higher control voltage translates to larger conduction angle translates to higher RMS voltage across the resistive coils. Higher voltage translates to higher current and higher heat generated by the coils.

Another advantage of this power system and its variable coil configuration embodiment is that the number of coil groups can be increased due to smaller foot print of the solid state power. The increase in the number of coil groups allows these vertical furnaces to become configurable by software. Different power densities can be assigned to different portions of the furnace to compensate for different operation temperature ranges, ramp rates, cool down rates, etc. Power delivery to the furnace is made through every AC cycle (120 Hz for domestic 60 Hz) instead of the cycle average method (4 second pulse in conventional prior art furnaces). A smoother and faster response is obtained.

A further advantage is that a closed loop power controller can be used to regulate the power delivered to coil groups to compensate for input line voltage variations and load resistance changes. The closed loop power control can be run inside the regular furnace temperature closed loop (Cascade control). Redundant solid state controllers can be placed in circuit to replace or bypass faulty solid state controllers on operator command to increase the reliability of furnace.

A still further advantage is the ability of this system to provide predictive coil failure warnings to the operator when the nominal coil current through the solid state controller has changed beyond a predetermined threshold.

It will be readily apparent to a person skilled in the art that numerous modifications and variations of the present invention are possible in light of the above teachings. It is therefore to be understood that, within the scope of the appended claims, the invention may be practiced other than as specifically described herein.

The invention claimed is:

1. A vertical rapid heating and cooling furnace for treating semiconductor wafers, comprising:
    a hot wall reaction tube positioned within an array of heating elements spaced therefrom, the spacing between the hot wall tube and the array of heating elements defining a cooling gas passageway therebetween and an exhaust conduit, the cooling gas passageway having a first end communicating with a cooling gas inlet and a second end communicating with the exhaust conduit, wherein cooling gas passed through the cooling gas passageway to the exhaust conduit removes heat from the furnace;
    an insulation member including an axially concentric stack of rings of insulation which each have an upper and a lower annular interior curved surface shaped to receive a heating element, the insulation member positioned in a surrounding relationship to the array of heating elements and including anchor receiving recesses formed in an interior of the insulation member to provide support of the array of heating elements; and
    a plurality of anchors which each include a proximal end positioned in an anchor receiving recess in the interior of the insulation member and a distal end coupled with the array of heating elements.

2. The furnace of claim 1, wherein the array of heating elements includes an axially concentric array of circular heating elements.

3. The furnace of claim 2, wherein each of a circular heating element is an electrically independent coil.

4. The furnace of claim 1, wherein each ring of insulation includes an upper and lower stacking surface and at least one of the upper and lower stacking surfaces has a plurality of anchor receiving recesses.

5. The furnace of claim 1, wherein the furnace is enclosed within a cabinet having an opening communicating with the gas exhaust duct to provide gas removal from the cabinet.

6. The furnace of claim 5 further including a valve member coupled to the exhaust conduit for closing communication between the exhaust conduit and the second end of the cooling gas passageway of the furnace when the furnace is in a heating phase.

7. The furnace of claim 6 further including a valve member coupled to the exhaust conduit for opening communication between the exhaust conduit and the second end of the cooling gas passageway of the furnace when the furnace is in a cooling phase.

8. The furnace of claim 5 further including a valve member coupled to the exhaust conduit for simultaneously opening communication between the exhaust conduit and the second end of the cooling gas passageway of the furnace and for closing communication between the exhaust conduit and the cabinet when the furnace is in a cooling phase.

9. The furnace of claim 6 wherein the valve member includes a valve mounted for pivotal movement from a first position for simultaneously opening communication between the exhaust conduit and the second end of the cooling gas passageway of the furnace, and for closing communication between the exhaust conduit and the cabinet when the furnace is in a cooling phase, to a second position for simultaneously closing communication between the exhaust conduit and the second end of the cooling gas passageway of the furnace, and for opening communication between the exhaust conduit and the cabinet when the furnace is in a cooling phase.

10. The furnace of claim 5 further including a valve member coupled to the exhaust conduit for simultaneously closing communication between the exhaust conduit and the second end of the cooling gas passageway of the furnace, and for opening communication between the exhaust conduit and the cabinet when the furnace is in a heating phase.

11. A vertical rapid heating furnace of claim 1 wherein one end of the furnace includes a cylindrical insulating heat block to reduce heat loss from the volume defined by said hot wall reaction tube.

12. A vertical rapid heating furnace of claim 11 including one or more silicon carbide disks positioned between said cylindrical insulating heat block and said hot wall reaction tube.

13. A vertical rapid heating furnace of claim 1 wherein the top portion of the furnace includes a furnace sealing surface, and the furnace includes an insulating cap having a cap sealing surface dimensioned and mounted to form a sealing engagement with said furnace sealing surface to seal and insulate the top of the furnace during a heating cycle when in a first position, and to open the top of the furnace during a cooling cycle when in a second position.

14. A vertical rapid heating and cooling furnace for treating semiconductor wafers, comprising:
- a hot wall reaction tube positioned within an array of heating elements spaced therefrom, the spacing between the hot wall tube and the array of heating elements defining a cooling gas passageway therebetween and an exhaust conduit, the cooling gas passageway having a first end communicating with a cooling gas inlet and a second end communicating with the exhaust conduit, wherein cooling gas passed through the cooling gas passageway to the exhaust conduit removes heat from the furnace;
- an insulation member positioned in a surrounding relationship to the array of heating elements and comprising an axially concentric stack of rings of insulation which each include an upper and lower stacking surface, at least one of the upper and lower stacking surfaces having a plurality of anchor receiving recesses to provide support of the array of heating elements; and
- a plurality of anchors which each include a distal end coupled with the array of heating elements and a proximal end positioned in one of the anchor receiving recesses.

15. The furnace of claim 14, wherein the array of heating elements includes an axially concentric array of heating elements.

16. The furnace of claim 15, wherein each heating element is an electrically independent coil.

17. The furnace of claim 14, wherein the furnace is enclosed within a cabinet having an opening communicating with the gas exhaust duct to provide gas removal from the cabinet.

18. The furnace of claim 17, further including a valve member coupled to the exhaust conduit for closing communication between the exhaust conduit and the second end of the cooling gas passageway of the furnace when the furnace is in a heating phase.

19. The furnace of claim 18, further including a valve member coupled to the exhaust conduit for opening communication between the exhaust conduit and the second end of the cooling gas passageway of the furnace when the furnace is in a cooling phase.

20. The furnace of claim 17, further including a valve member coupled to the exhaust conduit for simultaneously opening communication between the exhaust conduit and the second end of the cooling gas passageway of the furnace and for closing communication between the exhaust conduit and the cabinet when the furnace is in a cooling phase.

21. The furnace of claim 18, wherein the valve member includes a valve mounted for pivotal movement from a first position for simultaneously opening communication between the exhaust conduit and the second end of the cooling gas passageway of the furnace, and for closing communication between the exhaust conduit and the cabinet when the furnace is in a cooling phase, to a second position for simultaneously closing communication between the exhaust conduit and the second end of the cooling gas passageway of the furnace, and for opening communication between the exhaust conduit and the cabinet when the furnace is in a cooling phase.

22. The furnace of claim 17, further including a valve member coupled to the exhaust conduit for simultaneously closing communication between the exhaust conduit and the second end of the cooling gas passageway of the furnace, and for opening communication between the exhaust conduit and the cabinet when the furnace is in a heating phase.

23. The furnace of claim 14, wherein one end of the furnace includes a cylindrical insulating heat block to reduce heat loss from the volume defined by said hot wall reaction tube.

24. The furnace of claim 23, including one or more silicon carbide disks positioned between said cylindrical insulating heat block and said hot wall reaction tube.

25. The furnace of claim 14, wherein the top portion of the furnace includes a furnace sealing surface, and the furnace includes an insulating cap having a cap sealing surface dimensioned and mounted to form a sealing engagement with said furnace sealing surface to seal and insulate the top of the furnace during a heating cycle when in a first position, and to open the top of the furnace during a cooling cycle when in a second position.

26. A vertical rapid heating and cooling furnace for treating semiconductor wafers, comprising:
- a hot wall reaction tube positioned within an array of heating elements spaced therefrom, the spacing between the hot wall tube and the array of heating elements defining a cooling gas passageway therebetween and an exhaust conduit, the cooling gas passageway having a first end communicating with a cooling gas inlet and a second end communicating with the exhaust conduit, wherein cooling gas passed through the cooling gas passageway to the exhaust conduit removes heat from the furnace;
- an insulation member positioned in a surrounding relationship to the array of heating elements the insulation member including anchor receiving recesses formed in an interior of the insulation member to provide support of the array of heating elements, each anchor receiving recess having a T-shaped groove; and
- a plurality of anchors which each include a T-shaped proximal end positioned in one of the T-shaped grooves and a distal end coupled with the array of heating elements.

27. The furnace of claim 26, wherein the array of heating elements includes an axially concentric array of heating elements.

28. The furnace of claim 27, wherein each heating element is an electrically independent coil.

29. The furnace of claim 26, wherein the insulation member includes an axially concentric stack of rings of insulation, an interior surface of each ring having at least one annular curved surface shaped to receive a heating element.

30. The furnace of claim 29, wherein the interior surface of each ring includes an upper and a lower annular interior curved surface, each of the upper and lower annular curved surfaces being shaped to receive a heating element.

31. The furnace of claim 29, wherein each ring of insulation includes an upper and lower stacking surface, and at least one of the upper and lower stacking surfaces has a plurality of anchor receiving recesses.

32. The furnace of claim 26, wherein the furnace is enclosed within a cabinet having an opening communicating with the gas exhaust duct to provide gas removal from the cabinet.

33. The furnace of claim 32, further including a valve member coupled to the exhaust conduit for closing communication between the exhaust conduit and the second end of the cooling gas passageway of the furnace when the furnace is in a heating phase.

34. The furnace of claim 33, further including a valve member coupled to the exhaust conduit for opening communication between the exhaust conduit and the second end of the cooling gas passageway of the furnace when the furnace is in a cooling phase.

35. The furnace of claim 32, further including a valve member coupled to the exhaust conduit for simultaneously opening communication between the exhaust conduit and the second end of the cooling gas passageway of the furnace and for closing communication between the exhaust conduit and the cabinet when the furnace is in a cooling phase.

36. The furnace of claim 33, wherein the valve member includes a valve mounted for pivotal movement from a first position for simultaneously opening communication between the exhaust conduit and the second end of the cooling gas passageway of the furnace, and for closing communication between the exhaust conduit and the cabinet when the furnace is in a cooling phase, to a second position for simultaneously closing communication between the exhaust conduit and the second end of the cooling gas passageway of the furnace, and for opening communication between the exhaust conduit and the cabinet when the furnace is in a cooling phase.

37. The furnace of claim 32, further including a valve member coupled to the exhaust conduit for simultaneously closing communication between the exhaust conduit and the second end of the cooling gas passageway of the furnace, and for opening communication between the exhaust conduit and the cabinet when the furnace is in a heating phase.

38. The furnace of claim 26, wherein one end of the furnace includes a cylindrical insulating heat block to reduce heat loss from the volume defined by said hot wall reaction tube.

39. The furnace of claim 38, including one or more silicon carbide disks positioned between said cylindrical insulating heat block and said hot wall reaction tube.

40. The furnace of claim 26, wherein the top portion of the furnace includes a furnace sealing surface, and the furnace includes an insulating cap having a cap sealing surface dimensioned and mounted to form a sealing engagement with said furnace sealing surface to seal and insulate the top of the furnace during a heating cycle when in a first position, and to open the top of the furnace during a cooling cycle when in a second position.

41. A vertical rapid heating and cooling furnace for treating semiconductor wafers, comprising:

a hot wall reaction tube positioned within an array of heating elements spaced therefrom, the spacing between the hot wall tube and the array of heating elements defining a cooling gas passageway therebetween and an exhaust conduit, the cooling gas passageway having a first end communicating with a cooling gas inlet and a second end communicating with the exhaust conduit, wherein cooling gas passed through the cooling gas passageway to the exhaust conduit removes heat from the furnace;

an insulation member positioned in a surrounding relationship to the array of heating elements and including anchor receiving recesses formed in an interior of the insulation member to provide support of the array of heating elements; and a plurality of anchors which each include a proximal end positioned in an anchor receiving recess in the interior of the insulation member and a distal end positioned coupled with the array of heating elements; and a cabinet enclosing insulation member and having an opening communicating with the gas exhaust duct to provide gas removal from the cabinet; and a valve member coupled to the exhaust conduit for simultaneously opening communication between the exhaust conduit and the second end of the cooling gas passageway and for closing communication between the exhaust conduit and the cabinet when the furnace is in a cooling phase.

42. The furnace of claim 41, wherein the array of heating elements includes an axially concentric array of heating elements.

43. The furnace of claim 42, wherein each heating element is an electrically independent coil.

44. The furnace of claim 41, wherein the insulation member includes an axially concentric stack of rings of insulation, an interior surface of each ring having at least one annular curved surface shaped to receive a heating element.

45. The furnace of claim 44, wherein one end of the furnace includes a cylindrical insulating heat block to reduce heat loss from the volume defined by said hot wall reaction tube.

46. The furnace of claim 45, including one or more silicon carbide disks positioned between said cylindrical insulating heat block and said hot wall reaction tube.

47. The furnace of claim 41, wherein the top portion of the furnace includes a furnace sealing surface, and the furnace includes an insulating cap having a cap sealing surface dimensioned and mounted to form a sealing engagement with said furnace sealing surface to seal and insulate the top of the furnace during a heating cycle when in a first position, and to open the top of the furnace during a cooling cycle when in a second position.

48. A vertical rapid heating and cooling furnace for treating semiconductor wafers, comprising:

a hot wall reaction tube positioned within an array of heating elements spaced therefrom, the spacing between the hot wall tube and the array of heating elements defining a cooling gas passageway therebetween and an exhaust conduit, the cooling gas passageway having a first end communicating with a cooling gas inlet and a second end communicating with the exhaust conduit, wherein cooling gas passed through the cooling gas passageway to the exhaust conduit removes heat from the furnace;

an insulation member positioned in a surrounding relationship to the array of heating elements and including anchor receiving recesses formed in an interior of the insulation member to provide support of the array of heating elements; and a plurality of anchors which each include a proximal end positioned in an anchor receiving recess in the interior of the insulation member and a distal end positioned coupled with the array of heating elements; and a cabinet enclosing insulation member and having an opening communicating with the gas exhaust duct to provide gas removal from the cabinet; and a valve member coupled to the exhaust conduit including a valve mounted for pivotal movement from a first position for simultaneously opening communication between the exhaust conduit and the second end of the cooling gas passageway of the furnace and for closing communication between the exhaust conduit and the cabinet when the furnace is in a cooling phase, to a second position for simultaneously closing communication between the exhaust conduit and the second end of the cooling gas passageway of the furnace and for opening communication between the exhaust conduit and the cabinet when the furnace is in a heating phase.

49. The furnace of claim 48, wherein the array of heating elements includes an axially concentric array of heating elements.

50. The furnace of claim 49, wherein each heating element is an electrically independent coil.

51. The furnace of claim 48, wherein the insulation member includes an axially concentric stack of rings of insulation, an interior surface of each ring having at least one annular curved surface shaped to receive a heating element.

52. The furnace of claim 48, wherein one end of the furnace includes a cylindrical insulating heat block to reduce heat loss from the volume defined by said hot wall reaction tube.

53. The furnace of claim 52, including one or more silicon carbide disks positioned between said cylindrical insulating heat block and said hot wall reaction tube.

54. The furnace of claim 48, wherein the top portion of the furnace includes a furnace sealing surface, and the furnace includes an insulating cap having a cap sealing surface dimensioned and mounted to form a sealing engagement with said furnace sealing surface to seal and insulate the top of the furnace during a heating cycle when in a first position, and to open the top of the furnace during a cooling cycle when in a second position.

55. A vertical rapid heating and cooling furnace for treating semiconductor wafers, comprising:
- a hot wall reaction tube positioned within an array of heating elements spaced therefrom, the spacing between the hot wall tube and the array of heating elements defining a cooling gas passageway therebetween and an exhaust conduit, the cooling gas passageway having a first end communicating with a cooling gas inlet and a second end communicating with the exhaust conduit, wherein cooling gas passed through the cooling gas passageway to the exhaust conduit removes heat from the furnace;
- an insulation member positioned in a surrounding relationship to the array of heating elements and including anchor receiving recesses formed in an interior of the insulation member to provide support of the array of heating elements; and
- a plurality of anchors which each include a proximal end positioned in an anchor receiving recess in the interior of the insulation member and a distal end positioned coupled with the array of heating elements; and
- a cabinet enclosing insulation member and having an opening communicating with the gas exhaust duct to provide gas removal from the cabinet; and
- a valve member coupled to the exhaust conduit for simultaneously closing communication between the exhaust conduit and the second end of the cooling gas passageway of the furnace, and for opening communication between the exhaust conduit and the cabinet when the furnace is in a heating phase.

56. The furnace of claim 55, wherein the array of heating elements includes an axially concentric array of heating elements.

57. The furnace of claim 56, wherein each heating element is an electrically independent coil.

58. The furnace of claim 55, wherein the insulation member includes an axially concentric stack of rings of insulation, an interior surface of each ring having at least one annular curved surface shaped to receive a heating element.

59. The furnace of claim 55, wherein one end of the furnace includes a cylindrical insulating heat block to reduce heat loss from the volume defined by said hot wall reaction tube.

60. The furnace of claim 59, including one or more silicon carbide disks positioned between said cylindrical insulating heat block and said hot wall reaction tube.

61. The furnace of claim 55, wherein the top portion of the furnace includes a furnace sealing surface, and the furnace includes an insulating cap having a cap sealing surface dimensioned and mounted to form a sealing engagement with said furnace sealing surface to seal and insulate the top of the furnace during a heating cycle when in a first position, and to open the top of the furnace during a cooling cycle when in a second position.

62. A vertical rapid heating and cooling furnace for treating semiconductor wafers, comprising:
- a hot wall reaction tube positioned within an array of heating elements spaced therefrom, the spacing between the hot wall tube and the array of heating elements defining a cooling gas passageway therebetween and an exhaust conduit, the cooling gas passageway having a first end communicating with a cooling gas inlet and a second end communicating with the exhaust conduit, wherein cooling gas passed through the cooling gas passageway to the exhaust conduit removes heat from the furnace;
- an insulation member positioned in a surrounding relationship to the array of heating elements and including anchor receiving recesses formed in an interior of the insulation member to provide support of the array of heating elements;
- a plurality of anchors which each include a proximal end positioned in an anchor receiving recess in the interior of the insulation member and a distal end coupled with the array of heating elements;
- a cylindrical insulating heat block positioned at one end of the furnace to reduce heat loss from the volume defined by said hot wall reaction tube; and
- one or more silicon carbide disks positioned between the cylindrical insulating heat block and the hot wall reaction tube.

63. The furnace of claim 62, wherein the array of heating elements includes an axially concentric array of heating elements.

64. The furnace of claim 63, wherein each heating element is an electrically independent coil.

65. The furnace of claim 62, wherein the insulation member includes an axially concentric stack of rings of insulation, an interior surface of each ring having at least one annular curved surface shaped to receive a heating element.

66. The furnace of claim 62, wherein one end of the furnace includes a cylindrical insulating heat block to reduce heat loss from the volume defined by said hot wall reaction tube.

67. The furnace of claim 66, further comprising one or more silicon carbide disks positioned between said cylindrical insulating heat block and said hot wall reaction tube.

68. The furnace of claim 62, wherein the top portion of the furnace includes a furnace sealing surface, and the furnace includes an insulating cap having a cap sealing surface dimensioned and mounted to form a sealing engagement with said furnace sealing surface to seal and insulate the top of the furnace during a heating cycle when in a first position, and to open the top of the furnace during a cooling cycle when in a second position.

* * * * *